METHOD OF ETCHING A SEMICONDUCTOR WAFER TO PROVIDE TAPERED DICE

Original Filed Feb. 17, 1961

2 Sheets-Sheet 1

BREAKDOWN VOLTAGE AS A FUNCTION OF RESISTIVITY OF N TYPE SILICON COMPARING JUNCTIONS HAVING NEAR NORMAL SURFACE ANGLES WITH JUNCTIONS HAVING HIGHLY ACUTE SURFACE ANGLES.

INVENTOR.
O. Melville Clark
BY Mueller & Aichele
ATT'YS.

July 12, 1966 O. M. CLARK 3,260,634

METHOD OF ETCHING A SEMICONDUCTOR WAFER TO PROVIDE TAPERED DICE

Original Filed Feb. 17, 1961

2 Sheets-Sheet 2

INVENTOR.
O. Melville Clark
BY Mueller & Aichele
ATT'YS.

United States Patent Office 3,260,634

Patented July 12, 1966

3,260,634

METHOD OF ETCHING A SEMICONDUCTOR WAFER TO PROVIDE TAPERED DICE

Oscar Melville Clark, Scottsdale, Ariz., assignor to Motorola, Inc., Franklin Park, Ill., a corporation of Illinois Continuation of application Ser. No. 90,026, Feb. 17, 1961. This application Dec. 22, 1964, Ser. No. 423,633

1 Claim. (Cl. 156—17)

This application is a continuous of application Serial No. 90,026, filed February 17, 1961, now abandoned.

This invention relates to a particular construction for semiconductor dice which are the fundamental electrical elements in semiconductor rectifier devices. In particular, the invention relates to a diffused junction type rectifying element of a construction and configuration which enhances the voltage breakdown characteristics of the element, and to a method of fabricating such a rectifying element.

At the time of filing the above-noted original application there was a need for a small, lightweight, rugged component which could perform a high voltage rectification function in electronic equipment. The structure fabricated in accordance with the present invention has filled that need. Examples of special purpose equipments in which such components are useful are compact military type transmitters, portable television sets, photoflash units and scintillation counters. Such a high voltage element can be used in any equipment where there is a requirement to rectify alternating voltages of over 1000 volts, such as radar equipment, X-ray equipment and static electricity type pollen and dust precipitators.

In order to provide the high voltage breakdowns required for a component such as this prior to the present invention, it was necessary generally to use in the component a number of semiconductor dice connected in series, since the over-all high voltage reverse breakdown value of the component is the sum of the breakdown values of the individual dice. The use of multiple dice increases costs, complicates the assembly procedures and makes it more difficult to conduct heat from the die assemblies. Also, the use of multiple dice causes a considerably greater amount of heat to be generated within the package because the heat generated is directly proportional to the number of dice used. It is desirable, therefore, to attain the necessary voltage breakdown value with a smaller number of dice in series or with a single die.

An object of the invention is to provide semiconductor rectifying elements having unusually high reverse breakdown values which can be fabricated economically and are suitable for use in mass produced semiconductor devices.

Another object of the invention is to provide a high voltage rectifying element which dissipates a minimum amount of power.

Another object is to provide a high voltage rectifying semiconductor device which has the minimum possible number of die elements thereby simplifying the structure and reducing material and assembly costs.

Another object of the invention is to provide a high voltage rectifying element which readily transfers heat generated within it to a heat sink.

A feature of the invention is the attainment of unusually high reverse breakdown voltages in a single semiconductor die element by the use of a novel die configuration in which the peripheral die surface intersects the plane of the junction at a highly acute angle which may be considerably less than 50°, thereby decreasing the voltage gradient which is produced along the surface of the die at and near the junction in the operation of the die in a rectifier device. The attainment of very high breakdown voltages in a single die is of importance because it increases the number of applications in which a component having a single die can be used, and also because it reduces the number of dice required for applications in which a single die cannot be used.

Another feature of the invention is a method of fabricating semiconductor dice having the configuration discussed above by an etching operation which cuts a large number of dice out of a wafer of semiconductor material and at the same time inherently shapes the dice so that they have a peripheral surface of changing slope with the least slope occurring at the junction area, thereby maximizing the voltage breakdown characteristics of the dice.

Referring now to the drawings.

A semiconductor rectifying die in accordance with the invention is shaped somewhat like a truncated cone whose peripheral surface has a varying slope. An important characteristic of the shape is that at the point on the peripheral surface where the rectifying junction is exposed, there is an acute angle between the plane of the junction and the peripheral surface. It has been found that a rectifying element having this shape exhibits considerably higher reverse breakdown voltage characteristics than one in which the junction is more or less perpendicular to the peripheral surface of the die.

The shaping of the die surface is accomplished in the step of etching a wafer so as to divide it into a number of dice by controlling the etching process so that it produces a tapering peripheral surface on the dice. Specifically, the side of the wafer which is closest to the rectifying junction is masked with wax or other suitable resist material which completely covers that surface and prevents any etching action from occurring at that surface. The side of the wafer which is farther away from the rectifying junction is masked in a pattern such that the masking material covers only those portions of the wafer which will be dice after the etching, and leaves exposed regions between the dice areas which are to be etched away.

The resulting masked wafer is immersed in an etching solution for a period of time sufficient for the solution to etch completely through the wafer at the exposed regions, thus dividing the wafer into dice. The main significance of this method is that because the etching action begins at the side of the wafer away from the junction and progresses completely through the wafer from that side, the peripheral die surfaces become increasingly tapered as the etching progresses. Thus, the taper is greatest at the side of the die closest to the junction, and this causes the junction to have favorably high breakdown voltage characteristics.

Figure 1:
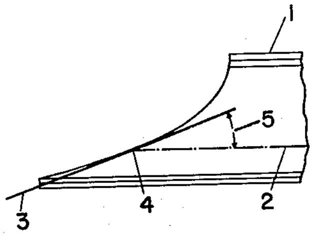
FIG. 1 is a highly magnified view of the peripheral surface of a semiconductor die element in accordance with the invention showing the highly acute angle between the plane of the rectifying junction represented by the dot-dash line and a plane tangent to the die surface at the junction.

FIG. 1 is a highly magnified view of the peripheral surface of a rectifier die in according with the invention, and this view clearly shows the highly acute angle 5 between the plane of the diffused rectifying junction 2 and a plane 3 tangent to the peripheral die surface at the point 4 where the diffused junction is exposed. Preferably this angle is less than 50° and satisfactory results have been obtained with a surface angle 5 in the range from about 25° to 30°.

Figure 2:
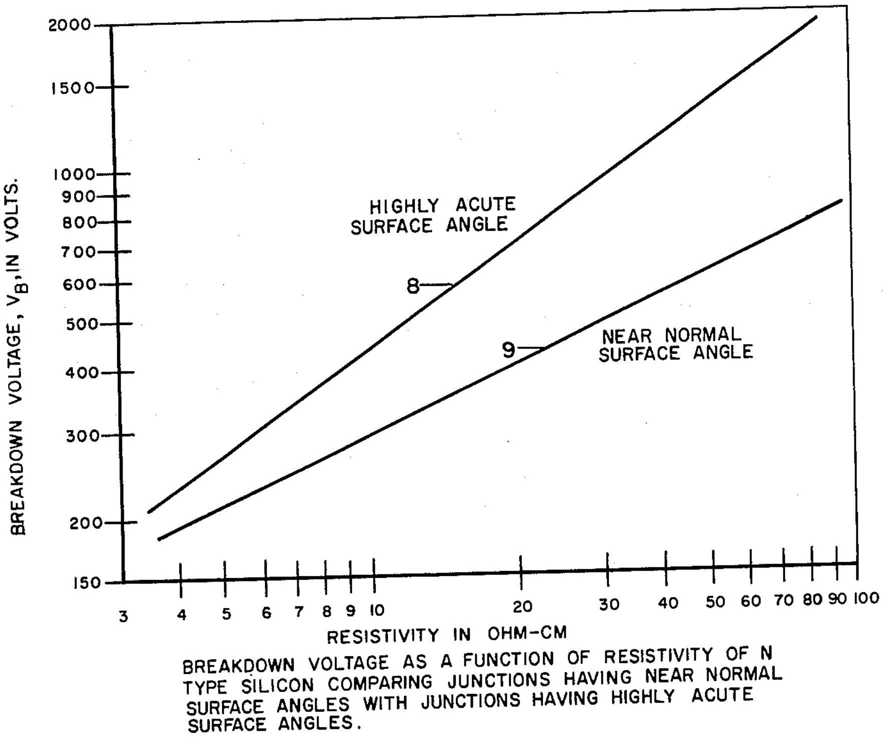
FIG. 2 is a graph of breakdown voltage versus resistivity of the semiconductor material for dice whose surface is nearly perpendicular to the junction as compared with dice as illustrated in FIG. 1 wherein the angle between the die surface and the rectifying junction is highly acute.

FIG. 2 is a plot which clearly shows the advantage of the highly acute surface angle die configuration shown in FIG. 1 over dice in which the junction intersects the die surface at nearly a right angle. In this figure the typical breakdown voltage realized is plotted on the ordinate, and the resistivity of the silicon material is plotted on the abscissa. The distribution of reverse breakdown voltages for the highly acute surface angle configuration is shown by line 8 in FIG. 2 and this should be compared with the distribution of breakdown voltages exhibited by the near normal surface angle configuration shown as line 9. The various resistivities shown along the abscissa represent typical resistivities which might be employed to make a variety of rectifier devices. It can be seen in FIG. 2 that at the lower resistivities the ratio of the highly acute surface angle breakdowns to the near normal surface angle breakdowns is considerably less than 2 to 1, while in the high resistivity regions of 20 ohm-cm. and above, the ratio of the highly acute surface angle breakdowns to the near normal surface angle breakdowns is 2 to 1 or greater. The usual resistivities employed for making the high voltage silicon rectifier devices is in the range of 60 ohm-cm. resistivity and above. Therefore, the improvement in breakdown voltage provided by the highly acute surface angle configuration over the near normal surface angle configuration is of greatest advantage in higher voltage rectifier devices. A theoretical explanation in support of this improvement will be presented in order to provide a fuller understanding of the invention.

When a reverse bias is applied to a die 1 as shown in FIG. 1, a space charge depletion region is established on each side ofthe PN junction 2. It is an inherent characteristic of PN junctions that the entire reverse voltage is distributed over a relatively small distance on either side of the junction. The voltage distribution coincides with the region over which the voltage is distributed. The fact that the entire verse voltage appears across a relatively short distance means that a very great electrostatic field exists over this distance. Experiments have shown that the breakdown of junctions having configurations of the type described herein is due largely to surface effects. Since the diffused junction is exposed all around the die periphery, this exposed region critically affects breakdown. In situations where the plane of the surface at the junction intersects the plane of the junction at near normal surface angles, the field existent along the surface on either side of the junction is very high since its location and gradient is determined by the space charge region. In dice having the configuration shown in FIGS. 1 and 3, the depletion region area appearing along the die surface on either side of the junction is stretched. The degree of stretching out is directly proportional to the reciprocal of the trigonometric sine of angle 5 of FIG. 1. This spreading out effect results in a proportionate spreading out of the electrostatic field at the surface. This reduces the voltage gradient existing along the surface near the point 4 of FIG. 1. This effect in turn increases the reverse voltage that can be applied before the junction will break down.

Figure 3:
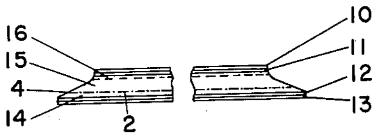
FIG. 3 is a magnified view of a semiconductor die element showing each region of different conductivity and indicating the rectifying junction in the die and the plated coatings on the upper and lower faces of the die.

FIG. 3 shows a magnified view of a complete semiconductor die element suitable for use in a high voltage rectifier. The central portion of the die is broken away in this view because of the difficulty of drawing such an enlarged view to scale. The basic material 15 of the semiconductor die element in this instance is silicon. The major upper and lower faces of the die have nickel plated inner layers 11 and 12 and have outer layers of gold plating 10 and 13. The gold material is readily solderable, and the nickel material provides satisfactory adherence of the plated coatings to the silicon. Region 15 is the basic N type silicon material. The diffused junction is located at 2. There is a diffused P+ type region at 14 and a diffused N+ type region at 16, and both of these regions are formed by diffusion methods which are not a part of the invention. The P+ region may be formed by diffusing acceptor impurity material such as boron into the original N type material, and the N+ region may be formed by diffusing donor type impurity material such as phosphorous into the original N type material. The region 16 is of greater electrical conductivity than the N type region 15 and is identified therefore as N+. The die is typically about 8 to 12 mils thick and has a diameter of the order of 70 to 125 mils.

Figures 4, 5, 7:
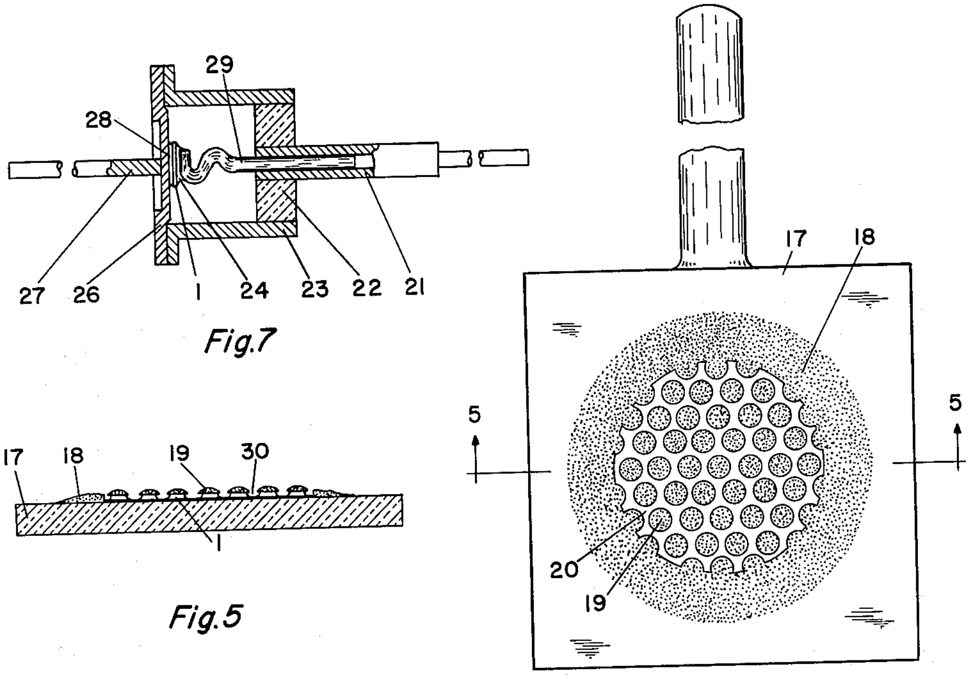
FIG. 4 shows a masked semiconductor wafer mounted in position on a paddle ready for the etching operation which forms the dice of the type shown in FIGS. 1 and 3.
FIG. 5 is a sectional view of FIG. 4 showing clearly the masked areas and the parts of the wafer that are removed during the etching operation.
FIG. 7 is a sectional view of a typical semiconductor high voltage rectifier showing the location of the semiconductor die element within the rectifier housing.
Figure 6:
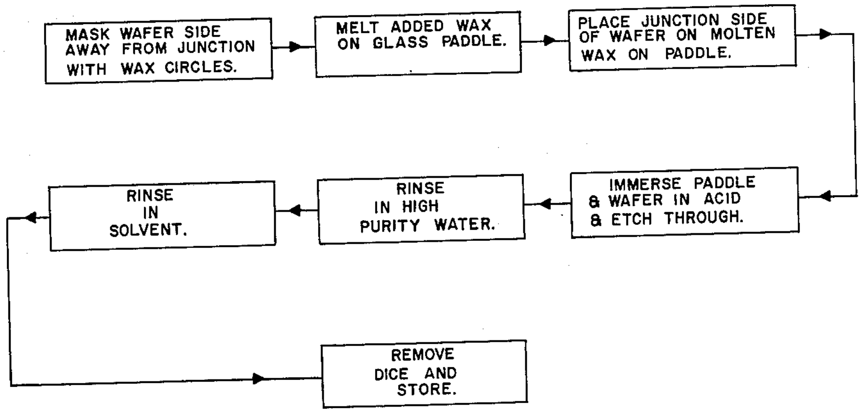
FIG. 6 is a process flow diagram showing the processing steps which are directly associated with forming the dice.

FIG. 6 is a process flow diagram which presents the important steps of the method of forming of the type dice shown in FIGS. 1 and 3. This method will now be presented in detail. A silicon wafer 20 having gold plated faces 10 and 13 (FIG. 4) is clamped within a metallic mask having a continuous pattern of holes on one side whose diameter is approximately one hundred thousandths of an inch. After the wafer is properly secured within the mask, acid resistant wax is sprayed through the holes in the mask causing wax circles 19 to be imprinted on one face of the wafer. It is very important that the wax circles appear on the face of the wafer farthest away from the PN junction 2, since it is desired to etch from this side. This method permits the attainment of the highly acute surface angle in the diffused junction region as previously mentioned. A glass paddle 17 shown in FIG. 4 is placed on a hot plate and additional wax 18 is melted on the surface of the paddle. When this wax 18 is completely melted into a puddle, the wafer 20 is placed in position on the molten wax with the junction side facing the paddle. The glass paddle 17 with the wafer 20 mounted on it is then removed from the hot plate and the wax is permitted to solidify. This secures the wafer to the paddle 17.

The paddle 17 with the wafer 20 mounted on it is then immersed in an aqua regia etching solution which removes the gold plating on the exposed wafer face. The paddle and wafer are rinsed in high purity water, and the assembly is then immersed in a hydrofluoric-nitric-acetic acid solution which cuts through the silicon material. A typical region which is etched away is shown at 30 in FIG. 5. This etching continues until the gold plating 13 becomes visible at the lower wafer face. The assembly is then rinsed in high purity water and is then immersed again in aqua regia to remove the lower face gold plating 13. The assembly is again rinsed in high purity water and is finally etched in a hydrofluoric-nitric acid solution. Another rinsing is then performed in high purity water and finally the assembly is rinsed in an ultrasonically agitated solvent bath. This causes the dice to separate from the assembly. The dice are then dried and stored.

FIG. 5 shows quite clearly, in a sectional view, the regions 30 on which the various acid baths operate to cut through the upper layer of gold plating, the silicon and also the bottom layer of gold plating. The condition of the die units shown in FIG. 5 is the condition that exists following the final aqua regia etching and prior to the solvent rinsing step. Since the etching progresses through the wafer from the side away from the rectifying junction, the etching produces dice with a tapered surface as shown in FIGS. 1 and 3 wherein the surface angle at the junction is highly acute.

FIG. 7 is a sectional view of a complete high voltage rectifier showing the die 1 located in its usual position mounted on the heat sink 26. This rectifier package is shown merely as one of many suitable packages for the die of the invention. The die 1 has been soldered in position on the heat sink by the solder layer 28 and the die's upper face has been secured to the S bend lead 29 by means of solder layer 24. The S bend lead 29 extends through, and is welded to the tube 21. The tube 21 is an integral part of the header 23 and is held in place by the glass region 22. The electrical lead 27 is welded to the heat sink 26 and provides the electrical contact to one side of die 1 through the heat sink and the soldered layer 28.

The particular rectifier die configuration described above results in unusually high reverse breakdown voltage characteristics as demonstrated by the data plotted in FIG. 2. The importance of the reduced electrostatic stress at the surface of the die in the region of the junction has been emphasized. When the angle of intersection between the plane of the junction and a plane tangent to the peripheral surface of the die at the junction is quite acute, the depletion layer which is produced in the electrical operation of the die as a rectifier spreads along a longer surface than when the junction is substantially perpendicular to the surface. This reduces the voltage gradient along the surface and since the effective surface field is thus weakened, there is less tendency for the junction to break down due to adverse effects of the surface field at the junction. Thus, higher reverse voltages can be applied to the die without causing the junction to break down.

The ability to use a single die in a high voltage rectifier is important because the amount of heat generated within the rectifier package is less when it has a single die than when it has more than one die. Also, heat is readily transferred from a single die to a heat sink. Where more than one die is required, a smaller number of dice may be used in a given application and this reduces the adverse effect of disproportionate voltage drops which may be produced across multiple die immediately after application of a reverse voltage. Also, material costs and assembly costs may be reduced and the assembly operation is simplified. Dice produced by other methods do not result in as favorable an angle of intersection of the die surface with the plane of the junction and therefore have inherently lower breakdowns. Since the voltage breakdown characteristics of a die are affected strongly by surface conditions at the junction, the voltage gradient at the surface of the die near the junction is a major contributing factor in the breakdown phenomenon. Thus, the advantage of the particular die configuration and etching method of the invention can be readily seen.

I claim:

A method of manufacturing a plurality of dice from a semiconductor wafer, each of which dice has a rectifying junction therein and is adapted for assembly in a rectifier, said method including providing a metal coating on each of the two opposite faces of a semiconductor wafer, applying a masking composition on the metal coating on one face of the wafer which composition outlines thereon a pattern for the outer edge of each of the plurality of dice to define such dice, applying an acid resistant wax coating to and mounting a flat-faced graspable member on the metal coating on the other face of the wafer, immersing said graspable member and wafer as an assembly in an etching solution and etching away said metal coating and the wafer on said one face in the outline corresponding to the pattern of the masking composition on said one face and etch-tapering each defined dice in the wafer at the etched surface of each in a configuration wherein the angle of greatest taper for each dice is at the rectifying junction, which said junction is nearer said other face than it is to said one face of the wafer and is tapered less than an angle of 50°, and etch-cutting entirely through said wafer coincident with said etching-away to provide the plurality of dice according to said pattern of the masking composition, and separating said etched-cut dice from the graspable member for subsequent assembly of each dice in a rectifier.

References Cited by the Examiner

UNITED STATES PATENTS

| | | | |
|---|---|---|---|
| 2,672,528 | 3/1954 | Shockley. | |
| 2,879,147 | 3/1959 | Baker | 156—11 |
| 2,944,321 | 7/1960 | Westberg. | |
| 2,951,191 | 8/1960 | Herzog. | |
| 3,046,176 | 7/1962 | Bosenberg. | |

ALEXANDER WYMAN, *Primary Examiner.*

JACOB STEINBERG, *Examiner.*